(12) United States Patent
Kim et al.

(10) Patent No.: US 8,076,688 B2
(45) Date of Patent: Dec. 13, 2011

(54) LIGHT EMITTING DIODE HAVING EXTENSIONS OF ELECTRODES FOR CURRENT SPREADING

(75) Inventors: Dae Won Kim, Seoul (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 488 days.

(21) Appl. No.: 12/442,267

(22) PCT Filed: Sep. 25, 2006

(86) PCT No.: PCT/KR2006/003804
§ 371 (c)(1),
(2), (4) Date: Mar. 20, 2009

(87) PCT Pub. No.: WO2008/038842
PCT Pub. Date: Apr. 3, 2008

(65) Prior Publication Data
US 2010/0044744 A1 Feb. 25, 2010

(51) Int. Cl.
*H01L 33/00* (2010.01)
(52) U.S. Cl. ..... 257/98; 257/91; 257/103; 257/E33.065; 257/E33.064; 257/E33.062; 438/22
(58) Field of Classification Search ............. 257/91, 257/98, 103, E33.062, E33.064, E33.065; 438/22
See application file for complete search history.

(56) References Cited

U.S. PATENT DOCUMENTS

| | | | |
|---|---|---|---|
| 6,518,598 B1 * | 2/2003 | Chen | ................ 257/91 |
| 6,614,056 B1 | 9/2003 | Tarsa et al. | |
| 6,885,036 B2 | 4/2005 | Tarsa et al. | |
| 6,972,437 B2 | 12/2005 | Kim | |
| 7,012,281 B2 | 3/2006 | Tsai et al. | |
| 7,439,550 B2 * | 10/2008 | Tomioka et al. | ................ 257/91 |
| D619,976 S * | 7/2010 | Liu et al. | ................ D13/180 |
| 2003/0218176 A1 * | 11/2003 | Zhao et al. | ................ 257/81 |
| 2006/0001035 A1 * | 1/2006 | Suehiro et al. | ................ 257/91 |
| 2006/0055309 A1 * | 3/2006 | Ono et al. | ................ 313/492 |

* cited by examiner

*Primary Examiner* — Meiya Li
(74) *Attorney, Agent, or Firm* — H.C. Park & Associates, PLC

(57) ABSTRACT

Disclosed is a light emitting diode having extensions of electrodes for improving current spreading. The light emitting diode includes a lower semiconductor layer, an upper semiconductor layer and an active layer, which are formed on a substrate. The upper semiconductor layer is located above the lower semiconductor layer such that edge regions of the lower semiconductor layer are exposed, and has indents indented in parallel with diagonal directions from positions in the edge regions adjacent to corners of the substrate in a clockwise or counterclockwise direction to expose the lower semiconductor layer. The indents have distal ends spaced apart from each other. Meanwhile, a lower electrode is formed on the exposed region of the lower semiconductor layer corresponding to the first corner of the substrate, and an upper electrode is formed on a transparent electrode layer on the semiconductor layer. Lower extensions extending from the lower electrode are formed on the exposed edge regions of the lower semiconductor layer and on the regions of the lower semiconductor layer exposed through the indents. An upper extension extending from the upper electrode are formed on the transparent electrode layer. The lower and upper extensions improve current spreading, particularly, in a light emitting diode with a large area.

8 Claims, 2 Drawing Sheets

LIGHT EMITTING DIODE HAVING EXTENSIONS OF ELECTRODES FOR CURRENT SPREADING

CROSS REFERENCE RELATED APPLICATION

This application is the National Stage of International Application No. PCT/KR2006/003804, filed Sep. 25, 2006, which is hereby incorporated by reference for all purposes as if fully set forth herein.

BACKGROUND OF THE INVENTION

1. Field of the Invention

The present invention relates to a light emitting diode, and more particularly, to a light emitting diode having extensions of electrodes for current spreading.

2. Discussion of the Background

Gallium nitride (GaN) based light emitting diodes have been applied and developed over about a decade. The GaN based LEDs have significantly changed LED technology and are currently used in a variety of applications such as full color LED display, LED traffic signals and white LEDs. In recent years, high-efficiency white LEDs are expected to substitute for fluorescent lamps. In particular, the efficiency of the white LEDs almost approaches that of a typical fluorescent lamp.

In general, a gallium nitride based light emitting diode is formed by growing epitaxial layers on a substrate such as a sapphire substrate, and has an N-type semiconductor layer, a P-type semiconductor layer, and an active layer interposed therebetween. Meanwhile, an N-electrode is formed on the N-type semiconductor layer, and a P-electrode is formed on the P-type semiconductor layer. The light emitting diode is driven while being electrically connected to an external power supply via the electrodes. At this time, a current flows from the P-electrode to the N-electrode via the semiconductor layers.

Since a typical P-type semiconductor layer has high resistivity, there is a problem in that a current is not evenly spread in the P-type semiconductor layer but is concentrated on a portion where the P-electrode is formed and intensively flows through corners. The current concentration leads to reduction in a light-emitting region and consequently degrades luminous efficiency. To solve these problems, a technique of forming a transparent electrode layer having low resistivity on a P-type semiconductor layer for current spreading has been used. A current introduced from the P-electrode spreads in the transparent electrode layer and flows into the P-type semiconductor layer. Thus, the light emitting region of the light emitting diode can be enlarged.

However, the transparent electrode layer has a restricted thickness because of its light absorption, causing a limitation on current spreading. In particular, the current spreading using the transparent electrode layer has a limitation in a light emitting diode with a large area of about 1 mm$^2$ or more used for high output power.

Meanwhile, the current flows through the semiconductor layers toward the N-electrode. Accordingly, the current is concentrated on a portion of the N-type semiconductor layer where the N-electrode is formed. This means that the current flowing in the semiconductor layer is concentrated in the vicinity of a region formed with the N-type electrode. Accordingly, there is a need for a light emitting diode capable of solving a problem of current concentration in an N-type semiconductor layer.

SUMMARY OF THE INVENTION

An object of the present invention is to provide a light emitting diode capable of uniformly spreading a current which flows in operation.

Another object of the present invention is to provide a light emitting diode capable of preventing a current flowing along corners of the diode.

To achieve the objects, the present invention provides a light emitting diode having extensions of electrodes for current spreading. The light emitting diode includes a lower semiconductor layer, an upper semiconductor layer and an active layer, which are formed on a substrate. The upper semiconductor layer is located above the lower semiconductor layer such that edge regions of the lower semiconductor layer are exposed, and has indents. The respective indents are indented in parallel with diagonal directions from positions in the edge regions adjacent to corners of the substrate in a clockwise or counterclockwise direction to expose the lower semiconductor layer. The indents have distal ends spaced apart from each other. Meanwhile, a lower electrode is formed on the exposed region of the lower semiconductor layer corresponding to the first corner of the substrate, and an upper electrode is formed on a transparent electrode layer on the upper semiconductor layer. Lower extensions extending from the lower electrode are formed on the exposed edge regions of the lower semiconductor layer and on the regions of the lower semiconductor layer exposed through the indents. An upper extension extending from the upper electrode is formed on the transparent electrode layer. The lower extensions formed in the edge regions and the indents improve current spreading in the lower semiconductor layer, and the upper extension improves current spreading in the transparent electrode layer.

In addition, the lower extensions formed on the edge regions of the lower semiconductor layer may be terminated at positions spaced apart by predetermined distances from the second corner. Accordingly, a current may be prevented from intensively flowing through the second corner.

Meanwhile, the upper extension may comprise a first upper extension extending from the upper electrode to the center of the transparent electrode layer; and second, third and fourth upper extensions extending from the center to other corners excluding the second corner. These extensions are evenly arranged on the transparent electrode layer to assist in spreading a current in the transparent electrode layer.

Furthermore, the upper extension may further comprise sub-extensions that extend in parallel with the indents from the first to fourth upper extensions, respectively.

The distal ends of the indents may be spaced apart by the same distance from the first to fourth upper extensions adjacent thereto. Accordingly, a current can be evenly spread and flow in a vertical direction in the semiconductor layers.

Meanwhile, the transparent electrode layer may comprise an opening that exposes a corner of the upper semiconductor layer corresponding to the second corner of the substrate. At this time, the upper electrode covers the opening. Accordingly, a current can be prevented from intensively flowing through the corner adjacent to the portion where the upper electrode is formed.

The first and second corners may be opposite corners or adjacent corners. Since the lower electrode formed at the first corner extends to edge regions of the lower semiconductor layer by means of the lower extensions, the importance of the position where the lower electrode is formed is decreased. However, the lower and upper electrodes are formed at different corners, respectively.

Meanwhile, another lower electrode and another upper electrode may be formed at corners other than the first and second corners, respectively.

According to the present invention, it is possible to provide a light emitting diode capable of evenly spreading a current flowing in operation and preventing a current from intensively flowing through corners to improve luminous efficiency. In addition, current spreading can be maximized by arranging the lower and upper extensions in a rotationally symmetrical configuration.

DETAILED DESCRIPTION OF THE ILLUSTRATED EMBODIMENTS

Figure 1:
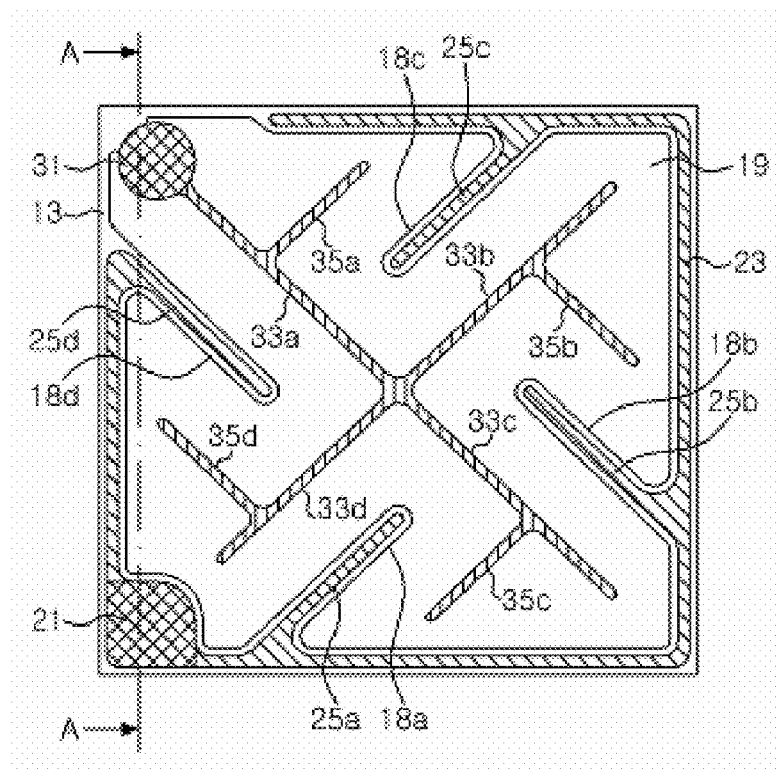
FIG. 1 is a plan view illustrating a light emitting diode having extensions of electrodes for current spreading according to an embodiment of the present invention.

Embodiments of the present invention will be described in greater detail with reference to the accompanying drawings. The following embodiments are provided as illustration to fully convey the spirit of the present invention to those skilled in the art. Thus, the present invention is not limited to the embodiments that will be described below but may be implemented in other forms. In the drawings, the width, length, thickness and the like of components may be exaggerated for the sake of convenience. Throughout the descriptions, like reference numerals designate like elements.

Figure 2:
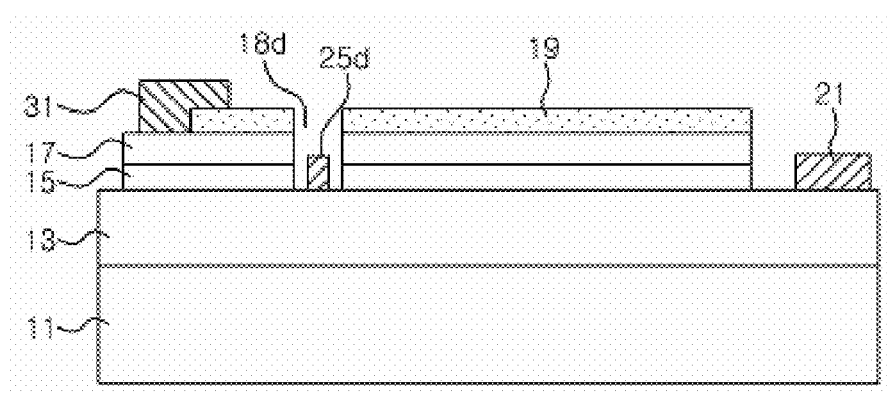
FIG. 2 is a cross-sectional view taken along line A-A of FIG. 1.

FIG. 1 is a plan view illustrating a light emitting diode having extensions of electrodes for current spreading according to an embodiment of the present invention, and FIG. 2 is a cross-sectional view taken along line A-A of FIG. 1.

Referring to FIGS. 1 and 2, a first conductive type lower semiconductor layer 13 is located on a substrate 11. The substrate 11 is not limited to a specific one and may be a sapphire substrate.

A second conductive type upper semiconductor layer 17 is located above the lower semiconductor layer 13. The upper semiconductor layer 17 is located in a region surrounded by edge regions of the lower semiconductor layer 13 so that the edge regions of the lower semiconductor layer 13 can be exposed. Meanwhile, the upper semiconductor layer 17 has indents 18a to 18d that are indented in parallel with a diagonal direction from positions adjacent to corners of the substrate to expose the lower semiconductor layer. The indents may be indented from positions adjacent to the corners of the substrate in a counterclockwise direction as shown in FIG. 1 but are not limited thereto. They may be indented from positions adjacent to the corners in a clockwise direction.

Distal ends of the indents are spaced apart from one another so that regions of the upper semiconductor layer are not isolated from one another. The indents may be formed in the same size and shape and arranged in a rotationally symmetrical configuration. The indents have a certain length such that they do not intersect diagonal lines, and the distal ends thereof may be spaced apart by the same distance from the diagonal lines adjacent thereto.

Further, an active layer 15 is interposed between the lower semiconductor layer 13 and the upper semiconductor layer 17. The active layer 15 is located beneath the upper semiconductor layer 17 and still exposes the edge regions of the lower semiconductor layer 13 and the regions of the lower semiconductor layer corresponding to the indents 18a to 18d.

The lower semiconductor layer 13, the active layer 15 and the upper semiconductor layer 17 may be formed of a gallium nitride based semiconductor compound, i.e., (B, Al, In, Ga)N. The active layer 15 has components and a composition ratio that are determined to emit light with a required wavelength, e.g., ultraviolet light or blue light. The lower and upper semiconductor layers 13 and 17 are formed of a material having a band gap larger than that of the active layer 15.

The lower semiconductor layer 13 and/or the upper semiconductor layer 17 may be formed in a single-layered structure as shown in FIG. 2 or a multi-layered structure. The active layer 15 may have a single or multi quantum well structure. Further, a buffer layer (not shown) may be interposed between the substrate 11 and the lower semiconductor layer 13. The buffer layer is employed to relieve lattice mismatch between the substrate 11 and the lower semiconductor layer 13.

The semiconductor layers 13, 15 and 17 may be formed using metalorganic chemical vapor deposition (MOCVD) techniques or molecular beam epitaxy (MBE) techniques, and may be patterned through photolithographic and etching processes so that certain regions of the lower semiconductor layer 13 are exposed.

A lower electrode 21 is located on an exposed portion of the lower semiconductor layer 13 at a first corner of the substrate 11 (i.e., a lower left corner in the figures). A transparent electrode layer 19 is formed on the upper semiconductor layer 17, and an upper electrode 31 is located on a portion of the transparent electrode layer at a second corner of the substrate (i.e., an upper left corner in the figure).

First lower extensions 23 formed on the exposed edge regions of the lower semiconductor layer, and second lower extensions 25a to 25d formed on the regions of the lower semiconductor layer exposed by the indents extend from the lower electrode 21. The first lower extensions 23 extend from the lower electrode 21 to both side edge regions, and the second lower extensions extend from the first lower extensions 23 into the indents. The lower electrode and the lower extensions may be simultaneously formed of the same material and through the same process. For example, if the lower semiconductor layer is of an N type, the lower electrode and the lower extensions may be formed of Ti/Al using a lift-off technique.

Meanwhile, the first lower extensions 23 extending from the lower electrode 21 to the both edge regions may be terminated at positions spaced apart by predetermined distances from the second corner. Accordingly, the upper electrode 31 and the positions where the first lower extensions are terminated are spaced apart from each other so that a current is prevented from intensively flowing from the upper electrode 31 to the lower extensions 23, and particularly a current is prevented from intensively flowing through the second corner.

The transparent electrode layer 19 may have an opening that exposes a corner of the upper semiconductor layer 17 corresponding to the second corner of the substrate. In this case, the upper electrode 31 covers the opening and is brought into contact with the upper semiconductor layer 17.

In general, the transparent electrode layer 19 is formed of an indium tin oxide (ITO) or Ni/Au to have optical transmittance and brought into ohmic contact with the upper semiconductor layer so as to lower contact resistance. However, the upper electrode 31 does not have optical transmittance and is not brought into ohmic contact with the upper semiconductor layer. The upper electrode 31 is brought into direct contact with the upper semiconductor layer 17, thereby preventing a current from flowing beneath the upper electrode 31. Accordingly, it is possible to prevent loss of generated light due to absorption of the light by the upper electrode 31. In addition, the upper electrode 31 is in contact with the upper semiconductor layer 17 at the corner of the upper semiconductor layer 17 so that a current can be prevented from flowing along the corner, resulting in enhanced current spreading.

Meanwhile, upper extensions are formed on the transparent electrode layer 19 and extend from the upper electrode 31. The upper electrode and the upper extensions may be formed of the same material and through the same process. The upper extensions may include a first upper extension 33a extending from the upper electrode to the center of the transparent electrode layer; and second, third and fourth upper extensions 33b to 33d extending from the center to other corners excluding the second corner.

In addition, sub-extensions 35a to 35d may extend from the first to fourth upper extensions 33a to 33d and in parallel with the indents, as shown in FIG. 1. The indents are interposed respectively between the sub-extensions and the first to fourth upper extensions. At this time, the second lower extensions, the upper extensions and the sub-extensions may be formed so that the second lower extensions formed in the indents are arranged in central regions between the sub-extensions and the upper extensions.

As a result, each of the upper extensions 33a to 33d is formed to be in parallel with one of the second lower extensions 25a to 25d formed in the indents. A current is uniformly spread in the transparent electrode layer 19 through the upper extensions and the sub-extensions, and the uniformly spread current evenly passes through the semiconductor layers 13, 15 and 17 toward the lower extensions 23 and 25a to 25d.

Although the first and second corners have been illustrated and described as being adjacent to each other in this embodiment, they may be opposite corners.

Figure 3:
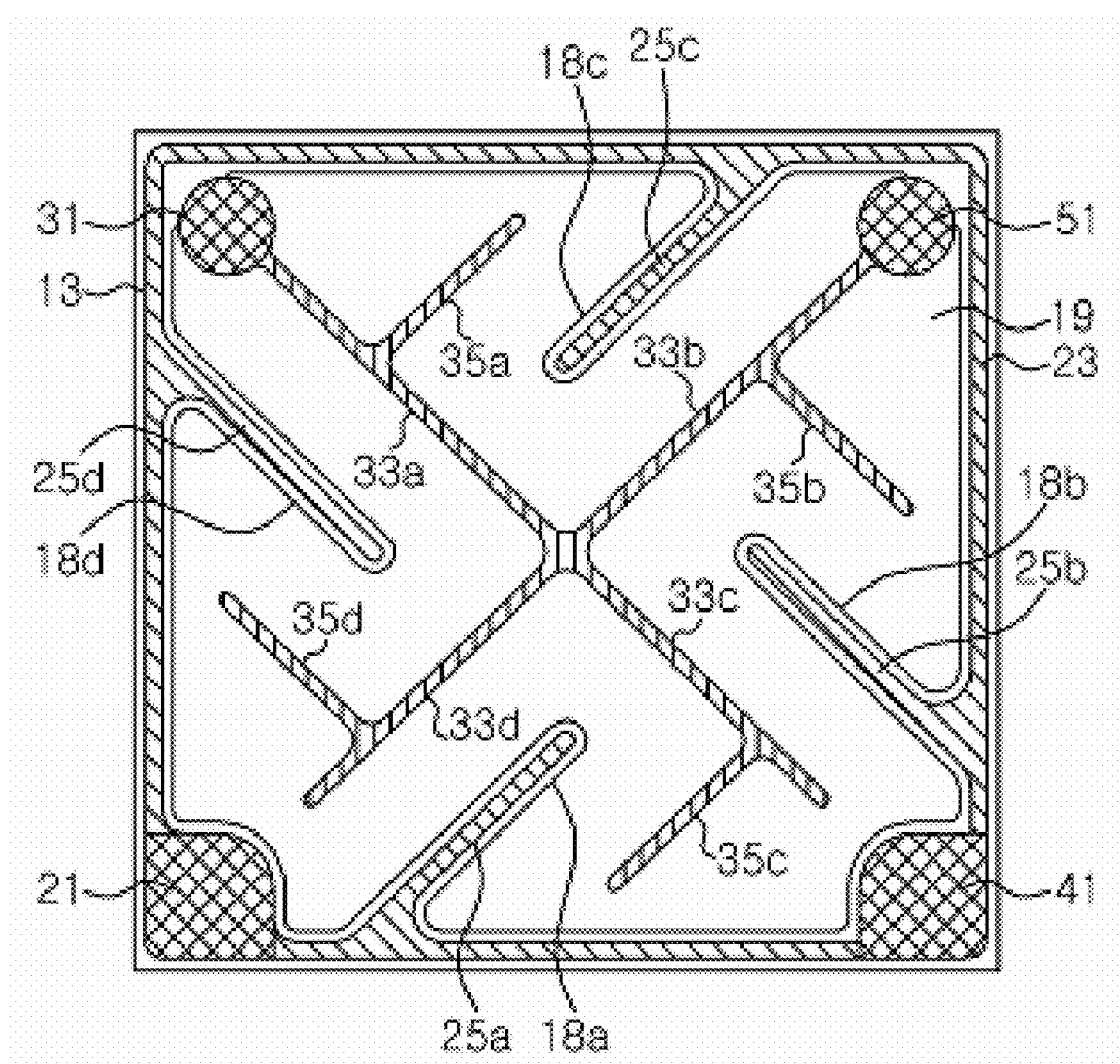
FIG. 3 is a plan view illustrating a light emitting diode having extensions of electrodes for current spreading according to another embodiment of the present invention.

FIG. 3 is a plan view illustrating a light emitting diode having extensions of electrodes for current spreading according to another embodiment of the present invention.

Referring to FIG. 3, the light emitting diode further includes a lower electrode 41 and an upper electrode 51 respectively formed at corners other than the first and second corners of the light emitting diode described with reference to FIGS. 1 and 2. The lower electrode 41 may be formed through the same process as the lower electrode 21, and the upper electrode 51 may be formed through the same process as the upper electrode 31. Further, the transparent electrode layer 19 can have an opening that exposes a corner of the upper semiconductor layer 17, and the opening can be covered with the upper electrode 51.

Although the lower electrodes 21 and 41 and the upper electrodes 31 and 51 have been illustrated as being formed at adjacent corners in this embodiment, the present invention is not limited thereto and the same electrodes may be formed at opposite corners. In this case, the first lower extensions 23 extending from the respective lower electrodes may be terminated at the corners where the upper electrodes are formed.

This embodiment has a disadvantage in that a light emitting region is decreased due to the formation of the lower and upper electrodes, but the formation of the two lower electrodes and the two upper electrodes can increase the number of pads for connection of bonding wires and further prevent a current from intensively flowing through the corners.

The invention claimed is:

1. A light emitting diode, comprising:
a lower semiconductor layer arranged on a substrate;
an upper semiconductor layer arranged above the lower semiconductor layer such that edge regions of the lower semiconductor layer are exposed, the upper semiconductor layer comprising indents that are parallel with diagonal directions from positions in the edge regions adjacent to corners of the substrate, the indents exposing the lower semiconductor layer and comprising distal ends spaced apart from each other;
an active layer disposed between the lower semiconductor layer and the upper semiconductor layer;
a lower electrode arranged on a first edge region of the edge regions of the lower semiconductor layer, the lower electrode corresponding to a first corner of the corners of the substrate;
a transparent electrode layer arranged on the upper semiconductor layer;
an upper electrode arranged on the transparent electrode layer, the upper electrode corresponding to a second corner of the corners of the substrate;
lower extensions extending from the lower electrode and arranged on a second edge region of the edge regions of the lower semiconductor layer and arranged on regions of the lower semiconductor layer exposed through the indents; and
an upper extension arranged on the transparent electrode layer and extending from the upper electrode.

2. The diode as claimed in claim 1, wherein the lower extensions arranged on the second edge region of the edge regions of the lower semiconductor layer are terminated at positions spaced apart from the second corner of the corners of the substrate.

3. The diode as claimed in claim 2, wherein the upper extension comprises:
a first upper extension extending from the upper electrode to the center of the transparent electrode layer; and
a second upper extension, a third upper extension, and a fourth upper extension extending from the center of the transparent electrode layer to other corners of the corners of the substrate excluding the second corner.

4. The diode as claimed in claim 3, wherein the upper extension further comprises sub-extensions extending from the first upper extension, the second upper extension, the third upper extension, and the fourth upper extensions, the sub-extensions in parallel with the indents, respectively.

5. The diode as claimed in claim 4, wherein the distal ends of the indents are spaced apart by the same distance from the first upper extension, the second upper extension, the third upper extension, and the fourth upper extension adjacent thereto.

6. The diode as claimed in claim 1, wherein the transparent electrode layer comprises an opening that exposes a corner of the upper semiconductor layer that corresponds to the second corner of the corners of the substrate, and the upper electrode covers the opening.

7. The diode as claimed in claim 1, wherein the first corner of the corners of the substrate and the second corner of the corners of the substrate are adjacent to each other.

8. The diode as claimed in claim 7, further comprising another lower electrode and another upper electrode arranged at other corners of the corners of the substrate opposite to the first corner of the corners of the substrate and the second corner of the corners of the substrate.

* * * * *